May 17, 1960

D. W. BULGER 2,937,358

PRINTED CIRCUIT SANDWICHED IN GLASS

Filed April 18, 1955

Inventor:
Donald W. Bulger,
by Claude A. Mott
His Attorney.

2,937,358

PRINTED CIRCUIT SANDWICHED IN GLASS

Donald W. Bulger, Albany, N.Y., assignor to General Electric Company, a corporation of New York Application April 18, 1955, Serial No. 502,021
7 Claims. (Cl. 339—17)

This invention generally relates to printed electrical circuits and more particularly to an improved printed circuit and to the process of fabricating this circuit.

Conventional printed electrical circuits have been unsatisfactory when used in environments of high humidity or where they are subject to being wetted, since the moisture or vapor in combination with dust or other particles provides undesired low resistance short-circuiting paths between the printed wires. This condition is particularly pronounced and troublesome where such printed circuits are also subjected to rapid changes in temperature since this creates periodic condensation on the printed circuit pattern and results in intermittent short circuits.

To eliminate this difficulty, casting resins and other organic materials have been used heretofore to impregnate or otherwise cover the printed circuit and components and provide a moisture proof seal. However, these coverings have been unsatisfactory since they both increase the weight of the circuit and prevent access to the circuit and components for repair or replacement. Moreover, in these prior processes the electrical components are individually soldered to the printed wiring junction points prior to the impregnation process. Individually soldering the components requires considerable care, skill, and considerable time in the assembly of these components to the circuit.

In accordance with the present invention, an improved printed circuit and process of fabrication is provided that enables the fluid and moisture proof sealing of the printed circuit prior to the assembly of the electrical components thereto. By sealing the basic printed circuit wiring prior to the assembly of components, the fabricating time and expense of the complete assembly is considerably decreased since the printed circuit wiring can be completed in an assembly line process and thereafter all components may be electrically connected to the wiring, together, in a single "dip soldering process" or the like without exposing the printed wiring to the heat and molten solder. Furthermore, by sealing the circuit itself and not the components, faulty or defective components can be readily repaired or replaced without the need of removing the covering or sealing materials heretofore employed.

It is accordingly one object of the present invention to provide an improved process for fabricating a moisture and fluid-proof printed circuit.

A further object of the invention is to provide an improved printed circuit assembly that is lighter in weight, and more readily repairable than prior devices.

A still further object of the present invention is to provide an improved moisture and fluid-proof printed circuit and process that may be more readily fabricated and repaired than prior devices and processes.

Other objects and many attendant advantages of this invention will be more readily comprehended by those skilled in the art upon a detailed consideration of the following specification taken with the accompanying drawings wherein.

Figures 1, 2, 3:
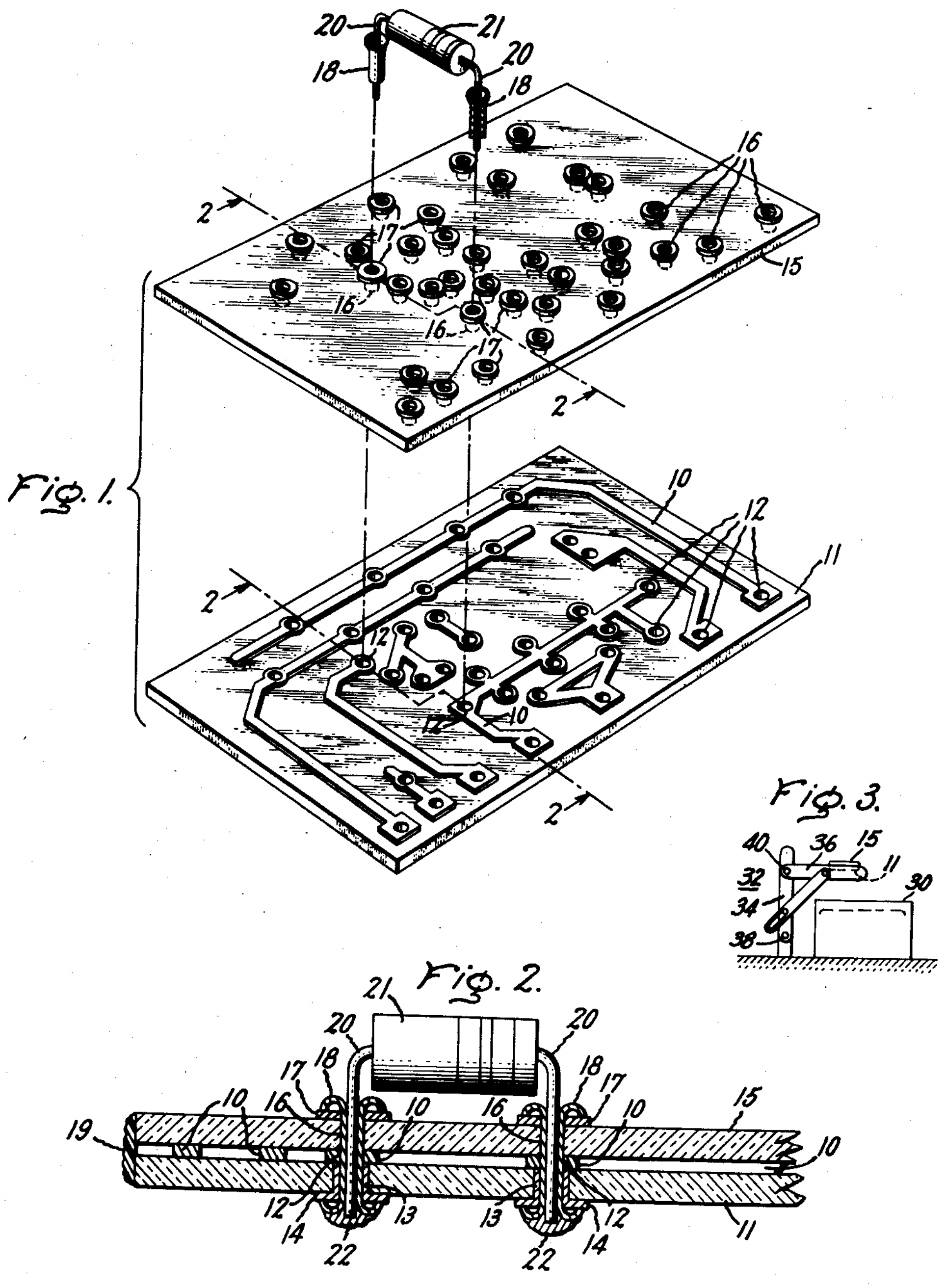
Fig. 1 is a perspective view of a printed circuit incorporating the present invention having the parts thereof in exploded relation.
Fig. 2 is a sectional view taken through line 2—2 of Fig. 1.
Fig. 3 is an elevation view showing the dip process in diagrammatic form.

Referring now to Figs. 1 and 2 taken together for a detailed consideration of one preferred embodiment of the present invention, the basic printed circuit 10 may be formed on the surface of a chassis member or plate 11 that is initially provided with a number of apertures 12 in a predetermined arrangement, one aperture 12 for each junction or terminal wherein it is desired to electrically fasten a resistor, capacitor, or other electrical component to the printed wiring 10. As may be more readily observed in Fig. 2, the conducting wiring 10 or metal deposit is also preferably formed by plating, etching or the like, the conducting material through the apertures 12 and onto the opposite side of the chassis member 11, as shown, to form a substantially cylindrical conducting lining 13 through the apertures having a lip or ledge 14 adhered to the opposite side of the chassis 11, and forming a substantially C-shaped cross section as shown in Fig. 2. By forming this conducting lining through the apertures, continuous electrical circuits are provided through the chassis 10 from the printed wiring pattern on its upper surface.

In the following step, a substantially identical upper chassis member 15 is provided, that is preferably coextensive in length and width with the lower chassis member 10, and having an equal number of preselected spaced apertures 16 in alignment with the apertures 12 on the lower chassis 11. Surrounding each of the apertures 16 on the upper surface of top plate or chassis 15 is formed and adhered a printed conducting ring 17, whereby when the upper chassis 15 is positioned to overlie the lower chassis 11, thereby sandwiching the printed circuit 10 intermediate these members, an electrical connection may be made to the electrical printed circuit 10 and through both chassis members by connector means in the form of eyelets, rivets 18 or the like, whose ends may be swaged to the rings 14 and 17 formed on the outer surfaces of the chassis members 11 and 15, all as shown by Fig. 2.

In the following step after the rivets or eyelets 18 have been used to both mechanically fasten the chassis 11 and 15 together and electrically connect the plated portion 17 about the upper surface of chassis 15 and the plated portion 14 about the lower apertured surface of chassis 11, these rivets or eyelets 18 may all be soldered to the plated portions together in a single operation by means of a "dip soldering" technique or the like.

The "dip process" technique of soldering, is well known to those skilled in the art. This process is diagrammatically shown in Fig. 3 wherein there is shown a tank 30 which is filled with molten solder. The joined chassis members 11 and 15 are mounted on a rotatable member such as for example member 32 comprising arms 34 and 36. As shown, the chassis members of which only 15 can be seen is mounted between a pair of arms 36 (only one of which is shown). Member 32 is then rotated forward toward tank 30, the member pivoting about 38. As the member 32 pivots forward, the arm 36 rotates about pivot point 40 so as to remain in a horizontal position. The chassis member between the arms 36 is thereby dipped into the molten solder within tank 30, whereby all the exposed connections are soldered together as is clearly shown in Fig. 2.

To complete the hermetic sealing of the printed circuit and to prevent any of the molten solder from entering through the exposed edges of the sandwiched plates 11 and 15, it is preferred to provide a seal 19 joining all edges of both chassis members, as shown in Fig. 2.

In the final steps of this process, the leads 20 of the electrical components 21 may be inserted within the openings of the eyelets 18, as shown in Fig. 1, and the complete circuit assembled. Thereafter, these electrical leads 20 may be soldered to the eyelets as shown by 22, Fig. 2 to form good mechanical and electrical bonds by dipping the completed printed circuit within molten solder by means of the conventional "dip process" technique; or they may be otherwise fastened to the eyelets 18 individually or jointly, as desired.

Thus, by means of the present invention, it is observed that the printed circuit wiring 11 is sandwiched between two suitable non-conducting chassis members, and the electrical connection junction points for each of these printed wiring terminals are brought outside of the sealed enclosure, as desired. This enables the printed circuit to be fabricated and completed independently of the assembly of electrical components to it, thereby facilitating the mass production of these boards. Furthermore, by mechanically sealing the printed circuit wiring 10 from the electrical terminals of the components, it is observed that by employing a "dip soldering" or other electrical connecting technique, all of the components may be soldered or otherwise mechanically and electrically connected to the completed printed circuit in a single operation without danger of the molten metal being deposited on the printed circuit configuration and without exposing the printed circuit to the heat of the molten solder.

*Preferred components and details of the process steps*

The chassis members 11 and 15 are preferably in the form of flat plates of suitable non-conducting material, such as phenolic boards or ceramic varieties of glass, both having high breaking strength and the desired non-conducting properties. The ceramic varieties of glass, having a breaking strength in the order of 19,000 lbs./sq. inch, as compared to 4,000 or 5,000 lbs./sq. inch of ordinary glass, are preferred over other types of boards since they are strong; they exhibit very small dimensional change with time; they are not subject to warpage with changes of heat and temperature; and they can tolerate relatively high temperatures without blistering or changing dimension in any way when exposed to the high temperatures during the "dip soldering" process.

The printed circuit wiring 10 may be etched, deposited by plating or soldering or otherwise formed in any one of a number of ways known in the art. The moisture-proof sealing means 19 for joining the edges of the chassis 11 and 15 may likewise be performed by any of the processes known in the art. However, if the chassis 11 and 15 are made of the preferred ceramic varieties of glass, it is preferred to seal these members by depositing and baking a sintered powder, such as silver or the like, over the edge surfaces and thereafter depositing a suitable thickness of solder 19 over these prepared edges to join and seal these edges together. This latter process is well known as a metal-to-glass hermetic sealing technique.

Although but one preferred product and process of this invention has been illustrated and described, it is obvious that those skilled in the art may make many changes in this disclosed process and product without departing from the spirit and scope of this invention. Accordingly, this invention is to be considered as being limited only by the claims annexed hereto.

What I claim as new and desire to secure by Letters Patent of the United States is:

1. In a process for fabricating a fluid and moisture proof printed circuit the steps of: providing two chassis members of substantially identical dimension and each having in alignment with the other a plurality of apertures therethrough at preselected junction points of a desired printed wire configuration, forming the desired printed wiring configuration on the surface of one of said chassis members with this wiring extending through the apertures and onto the opposite surface of this chassis to form a conducting liner therethrough and to provide a small conducting area about the aperture opening on said opposite side, and fastening said chassis members together to sandwich the printed wiring therebetween with said apertures in alignment by swaging hollow rivets inserted through said apertures to the outer surface of said chassis members and sealing the edges of said chassis and the apertures through said chassis to moisture-proof the printed wiring and provide electrical connection to said moisture-sealed printed wiring.

2. In a process for fabricating and assembling a fluid sealed printed circuit and assembling electrical components thereto, the steps of: providing two chassis members that are substantially identical in dimensions and each having in alignment with the other a plurality of apertures therethrough at preselected junction points of a desired printed wiring configuration, forming the desired printed wiring configuration on the surface of the first of said chassis with the formed wiring extending through the apertures thereof to form a conducting liner extending to the opposite surface thereof, forming a small conducting area about the aperture opening on the upper surface of the second chassis member, fastening said chassis members together with said apertures in alignment by electrically and mechanically joining said small conducting areas on the second chassis with the conducting liner of the first chassis member through the apertures of the first chassis by electrical connectors, hermetically sealing said electrical connectors, sealing all of the edges of said fastened chassis members by means of a leakproof fluid sealing means, and attaching the electrical components to the desired portions of the printed circuit by fastening the terminals thereof to predetermined ones of the electrical connectors and simultaneously soldering all of said terminals thereto.

3. A process for fabricating a fluid and moistureproof printed circuit comprising the steps of: providing a lower chassis member of non-conducting material with a number of apertures therethrough in a predetermined arrangement to conform to a desired printed wire configuration, forming the desired printed wire configuration on the upper surface of said lower chassis member with the wiring extending through said apertures and forming a small conducting area about said apertures on the lower surface of said lower chassis member, providing an upper chassis member of non-conducting material substantially identical to said lower chassis member with an equal number of apertures therethrough in alignment with said apertures on said lower chassis member, forming small conducting areas on the upper surface of said upper chassis member about said apertures in said upper chassis member, fastening said upper and lower chassis members together and electrically connecting said small conducting areas on said lower chassis member with said small conducting areas on said upper chassis member by swaging to said areas opposite ends of hollow rivets and sealing the edges of said fastened chassis members with a fluid and moistureproof sealing means.

4. A moisture-proof, sealed, printed circuit adapted for receiving electronic component leads comprising two substantially identical superimposed chassis members provided with a predetermined pattern of aligned apertures therethrough, a predetermined pattern of printed wiring in situ intermediate said members, said predetermined pattern forming a conducting liner through said apertures in one of said chassis members and forming a small conducting area about said apertures on the opposite side of said one chassis member, junction points formed in said printed wiring and about said apertures, moisture-proof sealing means interconnecting all extremeties of said members, and connector means extending through said apertures and secured to said small conducting areas, said connecting means being in the form of hollow rivets for enabling electrical connections to said junction points through said apertures while sealing said apertures to prevent the entry of moisture and fluid to said printed wiring.

5. A moisture-proof, sealed, printed circuit comprising two substantially identical superimposed chassis members provided with a predetermined pattern of aligned apertures therethrough, a predetermined pattern of printed wiring in situ intermediate said members and having desired junction points thereof in alignment with said apertures, said predetermined pattern of printed wiring extending through said apertures in one of said chassis members and forming a small conducting area on the outer side of said one chassis member, moisture-proof sealing means interconnecting all extremities of said members, and connector means secured to a portion of said printed wiring for enabling electrical connection to said junction points through said apertures while sealing said apertures to prevent the entry of moisture to said printed wiring, said connector means being in the form of hollow eyelets extending through said apertures and having flanged upper and lower portions adapted to grasp the outside surfaces of said superimposed chassis members.

6. A moisture-proof, sealed, printed circuit comprising two substantially identical superimposed chassis members provided with a predetermined pattern of aligned apertures therethrough, a predetermined pattern of printed wiring in situ intermediate said members and having desired junction points thereof in alignment with said apertures, portions of said printed wiring extending through said apertures in one of said chassis members and forming a small conducting area about said apertures on the outer side of said one chassis member, moisture-proof sealing means interconnecting all extremities of said members, and connector means extending through said apertures and secured to a portion of said printed wiring and adapted for receiving an electrical lead, said connector means performing the dual function of enabling electrical connection to said junction points through said apertures while sealing said apertures to prevent the entry of moisture to said printed wiring.

7. A moisture-proof, printed circuit comprising upper and lower superimposed chassis members provided with a predetermined pattern of aligned apertures therethrough, a predetermined pattern of printed wiring in situ intermediate said members and having the desired junction points thereof in alignment with said apertures, a portion of said printed wiring extending through said apertures in one of said chassis members and forming small conducting areas on the outer portion of said one chassis member, moisture-proof sealing means interconnecting all extremities of said members, electrical connector means extending through said apertures to opposite sides of said chassis to provide an electrical connection therethrough to said printed wiring, said connector means including hollow eyelet members extending through the aligned apertures of both members and having flanged portions on opposite ends thereof for engaging the upper surface of said upper member and the lower surface of said lower member and providing electrical terminal connectors to said printed wiring while sealing the aperture openings to prevent the entry of fluids and moisture to said printed wiring.

References Cited in the file of this patent

UNITED STATES PATENTS

| | | |
|---|---|---|
| 2,481,951 | Sabee et al. | Sept. 13, 1949 |
| 2,502,291 | Taylor | Mar. 28, 1950 |
| 2,593,479 | Nieter | Apr. 22, 1952 |
| 2,616,994 | Luhn | Nov. 4, 1952 |
| 2,683,839 | Beck | July 13, 1954 |
| 2,695,351 | Beck | Nov. 23, 1954 |
| 2,875,717 | McWilliams | Mar. 3, 1959 |